United States Patent
Yoshida

Patent Number: 5,891,243
Date of Patent: Apr. 6, 1999

[54] PRODUCTION OF HEAVY DOPED ZNSE CRYSTAL

[75] Inventor: Hiroshi Yoshida, Hyougo-ken, Japan

[73] Assignee: Japan Science and Technology Corporation, Saitama-ken, Japan

[21] Appl. No.: 908,307

[22] Filed: Aug. 7, 1997

[30] Foreign Application Priority Data

Aug. 8, 1996 [JP] Japan .................................. 8-225818

[51] Int. Cl.$^6$ .................................................. C30B 1/00
[52] U.S. Cl. .............................. 117/92; 117/108; 117/956
[58] Field of Search ............................ 117/92, 103, 104, 117/108, 956

[56] References Cited

U.S. PATENT DOCUMENTS

| | | | |
|---|---|---|---|
| 4,632,711 | 12/1986 | Fujita | 117/104 |
| 5,140,385 | 8/1992 | Kukimoto | 357/17 |
| 5,248,631 | 9/1993 | Park | 117/108 |

FOREIGN PATENT DOCUMENTS 64-25522 of 1989 Japan .................................. 117/956

OTHER PUBLICATIONS

"Heavily doped p. Znse: N grown by MBE"Appl. Phys. lett 59, 1991 pp. 2992 to 2994. DePuydt, 1991.
"Materials design of the codoping for the fabrication of low resistivity p.type Znse ... "Phys. Stat. sol (202) p. 763–773 Yoshida, 1997.

*Primary Examiner*—R. Bruce Breneman
*Attorney, Agent, or Firm*—Armstrong, Westerman, Hattori, McLeland & Naughton

[57] ABSTRACT

In a process for growing a ZnSe crystal by an MBE or MOCVD process, $N_2$ gas dissociated by electromagnetic waves and vapor In are prepared at a ratio of N:In being 2:1. The atomic gases may be prepared by decomposing InN at a high temperature with electromagnetic irradiation and adding $N_2$ gas to the decomposed product. The atomic gases are fed onto a substrate in a crystal growth region, so as to simultaneously dope ZnSe with In and N at a ratio of 1:2. A n-type dopant In substitutionally occupying a position of Zn makes a 1:1 couple with a p-type dopant N substitutionally occupying a position of Se, and another one N atom coordinates near the atomic couple and serves as an acceptor. As a result, the acceptor is kept in activated state up to higher concentration, and the ZnSe crystal can be heavily doped with the p-type dopant N.

4 Claims, 3 Drawing Sheets

ZnSe Crystal simultaneously doped with In, N

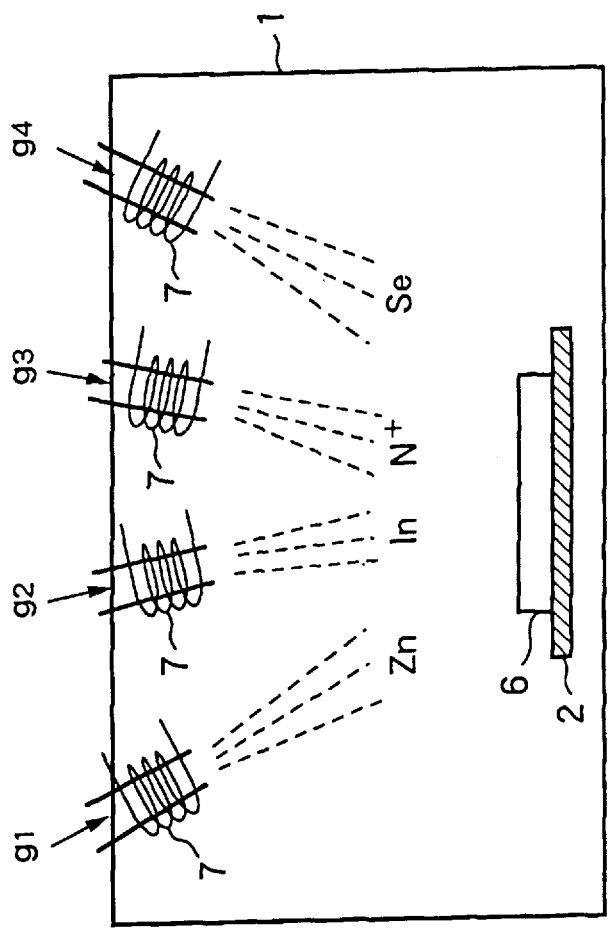

PRODUCTION OF HEAVY DOPED ZNSE CRYSTAL

BACKGROUND OF THE INVENTION

The present invention relates to a method of producing a p-type ZnSe crystal having low resistivity useful as a material for a blue laser, a blue light emitting device, etc.. ZnSe has been anticipated as a material for a blue laser, a blue light emitting device and so on, since its band gap corresponds to blue luminescence. A ZnSe crystal has been produced so far by a molecular beam epitaxy (MBE) process or a metal organic vapor deposition (MOCVD) process.

According to the MBE process, a metal element Zn and a non-metallic element Se are vaporized in an atmosphere at an ultra-high degree of vacuum so as to obtain an intensity of a molecular beam corresponding to vapor pressure of each element, and a crystal is grown up while controlling an atomic layer.

On the other hand, thermal decomposition of an organo-metallic compound is used for production of a ZnSe crystal in the MOCVD process.

In order to obtain a p-type ZnSe crystal, it is necessary to dope ZnSe with N during crystal growth. For N doping, gaseous $N_2$ molecules for instance are dissociated with electromagnetic wave RF, and radical N is introduced to ZnSe epitaxially growing on a substrate.

Since ZnSe is doped with sole N during crystal growth in a conventional method, acceptor concentration of N is not increased more than $10^{18}$ $cm^{-3}$. Even if further addition of N to ZnSe is tried, it is impossible to increase concentration of the carrier due to the compensation mechanism; a N atom located at a substitutional position of Se transfers to an interstitial position when acceptor concentration of N exceeds $10^{18}$ $cm^{-3}$ and turns to a donor (n-type), so that N atoms acting as p-type acceptors are diseffected by N atoms acting as p-type donors.

SUMMARY OF THE INVENTION

The object of the present invention is to offer a ZnSe single crystal having low resistivity heavily doped with N at acceptor concentration of $10^{19}$–$10^{21}$ $cm^{-3}$.

According to the present invention, atomic $N^+$ gas prepared by dissociating $N_2$ gas with electromagnetic irradiation and a gaseous complementary element X acting as a n-type dopant are prepared at an atomic ratio of N:X being 2:1. The atomic gases are fed to a region where a ZnSe crystal is epitaxially grown on a substrate by MBE or MOCVD process.

The atomic gases having the ratio of N:X being 2:1 may be prepared by decomposing XN with electromagnetic irradiation at a high temperature and adding $N_2$ gas to the decomposed product.

The substitutional element X may be In, Ga, Al etc.. In the hereunder explanation, the substitutional element X is represented by In.

BRIEF DESCRIPTION OF THE DRAWINGS

FIG. 3 is a schematic view illustrating an MOCVD apparatus for growth of a ZnSe crystal.

DETAILED DESCRIPTION OF THE PREFERRED EMBODIMENTS

When ZnSe is simultaneously doped with In acting as a n-type dopant and N acting as a p-type dopant at a ratio of In:N being 1:2, a donor $In^-_{Zn}$ derived from In substitutionally occupying a position of Zn makes a couple with an acceptor $N^+_{Se}$ derived from N substitutionally occupying a position of Se, and the replacement is stabilized due to an electrostatic energy generated by coupling +e with −e. The electrostatic energy stabilizes N which is further added to ZnSe. As a result, ZnSe is heavily doped with the p-type carrier (a hole) at acceptor concentration of $10^{19}$–$10^{21}$ $cm^{-3}$, although the acceptor concentration does not exceeds $10^{18}$ $cm^{-3}$ or so by addition of sole N.

Figure 1:
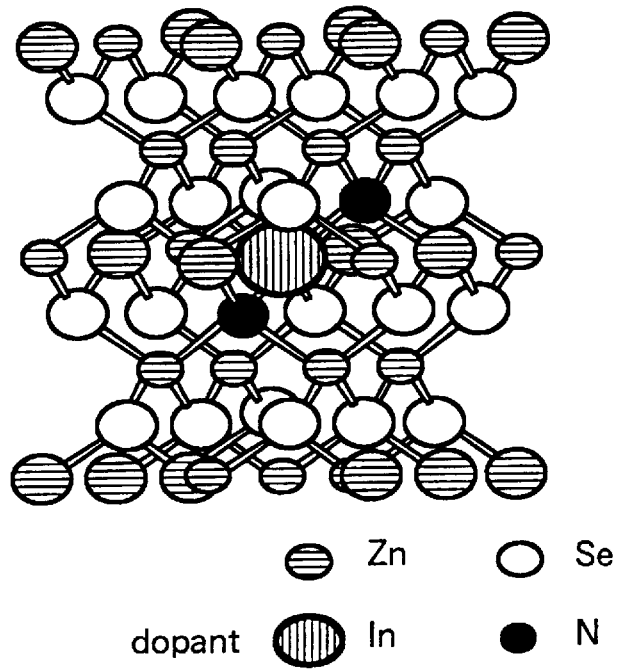
FIG. 1 illustrates a model of a ZnSe crystal simultaneously doped with In and N.
Figure 2:
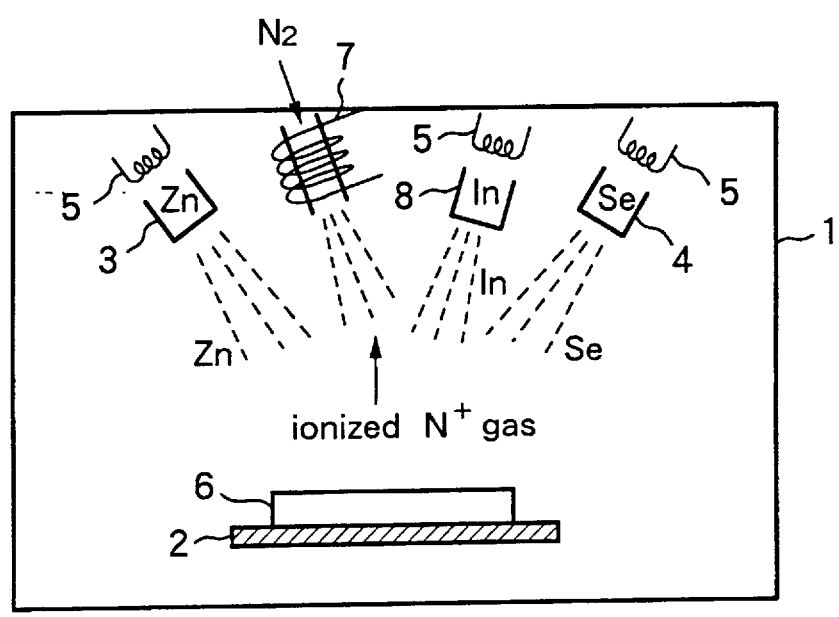
FIG. 2 is a schematic view illustrating an MBE apparatus for growth of a ZnSe crystal.

The reason why simultaneous In and N doping effectively increases the concentration of the p-type carrier is supposed as follows: When ZnSe is simultaneously doped with In and N at a ratio of 1:2, In substitutionally occupies a position of Zn, and N substitutionally occupies a position of Se, as illustrated in a model shown in FIG. 1. The n-type dopant In makes an atomic 1:1 couple with the p-type dopant N, and another one N atom coordinates near the atomic couple and serves as an acceptor. Consequently, the acceptor maintains its activity up to a higher concentration level so as to enable heavy doping with the p-type dopant N at high concentration.

According to MBE process for growth of a ZnSe crystal, a substrate 2 is located in a vacuum chamber 1, and a Zn source 3 and a Se source 4 are individually faced to the substrate 2, as shown in FIG. 3. Zn and Se vapors are generated by heating the Zn source 3 and the Se source 4 with corresponding heaters 5, fed onto the substrate 2 and epitaxially grown as a ZnSe crystal 6 on the substrate 2.

During growth of the ZnSe crystal, $N_2$ gas is irradiated with electromagnetic wave generated by a radio frequency (RF) coil 7 and dissociated to $N^+$. The resulting ionized $N^+$ gas is fed to the crystal growth region. At the same time, vapor In generated by heating an In source 8 with a heater 5 is also fed to the crystal growth region. The vapor In may be also supplied from a vapor source.

When a flow rate of ionized $N^+$ gas is controlled in relation with vapor In so as to adjust the atomic ratio of ionized $N^+$ gas to vapor In at 2:1, the ZnSe crystal 6 growing on the substrate 2 becomes a p-type crystal heavily doped with N.

According to MOCVD process, an organic Zn gas $g_1$, an organic In gas $g_2$, $N_2$ gas $g_3$ and an organic Se gas $g_4$ are individually decomposed and dissociated to atomic Zn, In, $N^+$ and Se with electromagnetic irradiation, and fed to a substrate 2. In this case, a flow rate of ionized $N^+$ gas is also controlled in relation with vapor In so as to adjust an atomic ratio of ionized $N^+$ gas to vapor In at 2:1. Due to the flow rate control, a ZnSe crystal 6 growing on the substrate 2 becomes a p-type crystal heavily doped with N.

The source of ionized $N^+$ and In vapor may be a compound of InN in any above-mentioned method of epitaxial crystal growth. In this case, InN is decomposed at a high temperature by irradiation with electromagnetic wave and supplied to a region for epitaxial crystal growth. Additional $N_2$ gas may be fed to the region for epitaxial crystal growth to adjust the atomic ratio of ionized $N^+$ gas to In vapor at 2:1.

N incorporated in the ZnSe crystal substitutionally occupies a position of Se and serves as a p-type acceptor $N^+_{Se}$, while In substitutionally occupies a position of Zn and serves as a n-type donor $In^-_{Zn}$. When the ZnSe crystal is doped with N and In at a ratio of 1:1, an acceptor charged with +e makes a couple with a donor charged with −e, so as to stabilize an electrostatic energy. When another one N is added to the ZnSe crystal stabilized in this way, a position of Se is stably substituted by N. Consequently, ZnSe can be heavily doped with N.

Figure 4A:
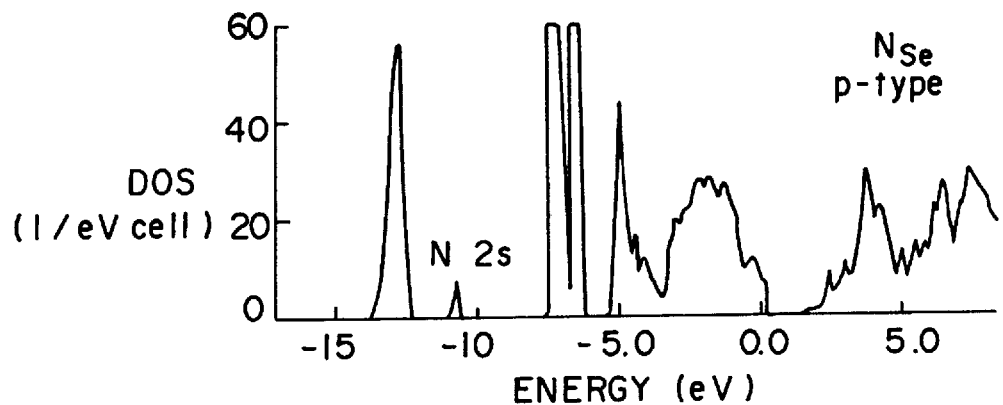
FIGS. 4(a) and 4(b) are graphs of electronic state density which shows that N substitutionally occupying a position of Se serves as a p-type acceptor, while In substitutionally occupying a position of Zn serves as a n-type donor.
Figure 4B:
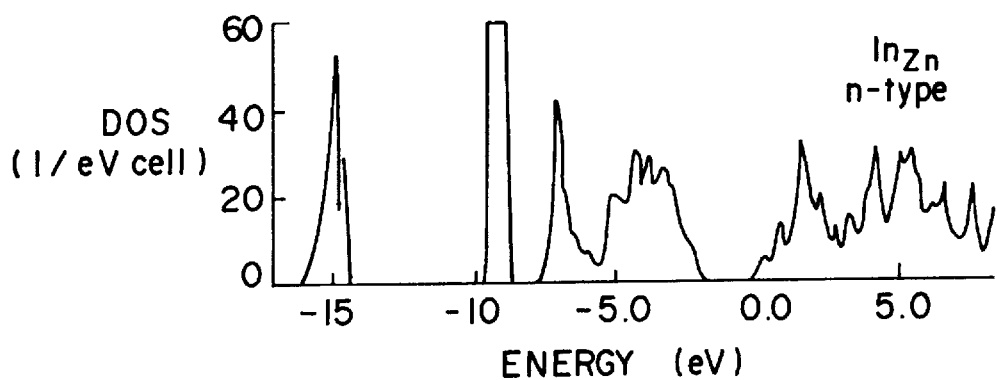

An upper column (a) of FIG. 4 shows a density of state of the N-doped ZnSe crystal wherein N atom substituted for Se. It is noted that N served as a p-type acceptor. On the other hand, it is noted that In served as a n-type donor from the lower column (b) of FIG. 4 showing a density of the In-doped ZnSe crystal wherein In atom substituted for Zn. From these data on the density of state, it is understood that an electrostatic energy can be stabilized by simultaneous N and In doping.

EXAMPLE

A ZnSe single crystal was used as a substrate 2 for growth of a ZnSe crystal thereon and located in a vacuum chamber 1 held at $1.3 \times 10^{-8}$ Pa. A ZnSe crystal was epitaxially grown at 250°–400° C. by supplying vapor Zn at a pressure of $1.3 \times 10^{-5}$ Pa., vapor Se at a pressure of $1.3 \times 10^{-5}$ Pa., ionized $N^+$ at a pressure of $1.3 \times 10^{-7}$ Pa. and vapor In at a pressure of $6.5 \times 10^{-7}$ Pa., respectively. Said ionized $N^+$ was prepared by irradiating $N_2$ gas with electromagnetic wave in a microwave range.

The obtained ZnSe crystal had an acceptor concentration which varied in response to a crystal growth temperature, as shown in Table 1. The ZnSe crystal was doped with N at a higher concentration at any crystal growth temperature, compared with a ZnSe crystal which was doped with sole N without feeding vapor In.

TABLE 1

EFFECT OF SIMULTANEOUS N AND In DOPING ON ACCEPTOR CONCENTRATION

| temperature of substrate (°C.) | acceptor concentration (cm$^{-3}$) | |
|---|---|---|
| | simultaneous doping with N and In | doping with sole N |
| 250 | $1 \times 10^{18}$ | $1 \times 10^{17}$ |
| 300 | $2 \times 10^{19}$ | $1 \times 10^{17}$ |
| 350 | $2 \times 10^{20}$ | $3 \times 10^{17}$ |
| 400 | $2 \times 10^{21}$ | $1 \times 10^{18}$ |

The similar simultaneous In and N doping was adopted in MOCVD process. In this case, a ZnSe crystal was also heavily doped with a p-type carrier at an acceptor concentration of $10^{19}$–$10^{21}$ cm$^{-3}$.

According to the present invention as aforementioned, ZnSe is simultaneously doped with a n-type dopant X and a p-type dopant N. Due to the simultaneous doping, a ZnSe crystal can be heavily doped with the p-type carrier at an acceptor concentration of $10^{19}$–$10^{21}$ cm$^{-3}$, compared that the acceptor n of the p-type carrier has been not more than $10^{18}$ cm$^{-3}$ or so in a conventional method.

The p-type ZnSe crystal obtained in this way exhibits excellent electric properties such as great p-type electronic conductivity and consequent low resistivity, since substantially all the N atoms incorporated in the crystal serve as active acceptors. Consequently, the doped ZnSe crystal is used as a material for an intensified blue laser, a blue light emitting device or the like in a high-density optical memory device, a full-color display, etc..

What is claimed is:

1. A method of producing a ZnSe crystal heavily doped with N serving as a p-type dopant, comprising the steps of:

disposing a ZnSe single crystal as a substrate in a vacuum chamber;

preparing Zn and Se vapors by heating a Zn source and a Se source by heaters, respectively;

dissociating $N_2$ gas to ionized $N^+$ gas with electromagnetic irradiation;

supplying said Zn and Se vapors together with said ionized $N^+$ gas to a region for epitaxial growth on said substrate;

simultaneously supplying a gaseous complementary element X which crystallographically substitutes for Zn to said region for epitaxial crystal growth; and epitaxially growing a ZnSe crystal doped with N and X on said substrate, wherein flow rates of said gaseous $N^+$ and X supplied to said region for epitaxial crystal growth are controlled at an atomic ratio of $N^+$:X being 2:1.

2. A method of producing a ZnSe crystal heavily doped with N serving as a p-type dopant, comprising the steps of:

disposing a ZnSe single crystal as a substrate in a vacuum chamber;

preparing Zn and Se vapors by decomposing organozincic and organoselenic compounds with electromagnetic irradiation;

preparing ionized $N^+$ gas by decomposing an N-containing compound with electromagnetic irradiation;

supplying said Zn and Se vapors together with said ionized $N^+$ gas to a region for epitaxial crystal growth on said substrate;

simultaneously supplying a gaseous complementary element X which crystallographically substitutes for Zn to said region for epitaxial crystal growth; and epitaxially growing a ZnSe crystal doped with N and X on said substrate, wherein flow rates of said gaseous $N^+$ and X supplied to said region for epitaxial crystal growth are controlled at an atomic ratio of $N^+$:X being 2:1.

3. The method of producing a ZnSe crystal heavily doped with N according to claim 1 or 2, wherein the complementary element X is an element selected from In, Ga, Al.

4. The method of producing a ZnSe crystal heavily doped with N according to claim 1 or 2, wherein the complementary element X is In, and prepared by decomposition of InN with electromagnetic irradiation.

* * * * *